United States Patent
Blinn

(10) Patent No.: US 10,826,283 B1
(45) Date of Patent: Nov. 3, 2020

(54) MODULAR BUSS BAR ELECTRICAL POWER DISTRIBUTION SYSTEM FOR CRANES, ELEVATORS AND HOISTS

(71) Applicant: Lawrence Blinn, Valley Cottage, NY (US)

(72) Inventor: Lawrence Blinn, Valley Cottage, NY (US)

(*) Notice: Subject to any disclaimer, the term of this patent is extended or adjusted under 35 U.S.C. 154(b) by 0 days.

(21) Appl. No.: 16/743,012

(22) Filed: Jan. 15, 2020

(51) Int. Cl.
*H02G 5/04* (2006.01)
*H02G 5/00* (2006.01)
*B66C 21/00* (2006.01)
*H05K 1/02* (2006.01)
*B66C 13/22* (2006.01)

(52) U.S. Cl.
CPC .............. *H02G 5/04* (2013.01); *B66C 13/22* (2013.01); *B66C 21/00* (2013.01); *H02G 5/002* (2013.01); *H05K 1/0201* (2013.01)

(58) Field of Classification Search
CPC ........................................................ H02G 5/04
USPC ..................................................... 174/70.008
See application file for complete search history.

(56) References Cited

U.S. PATENT DOCUMENTS

| | | | |
|---|---|---|---|
| 3,300,593 A | 1/1967 | Luberts | |
| 3,311,715 A | 3/1967 | Corl | |
| 3,316,362 A | 4/1967 | Mayo | |
| 9,407,079 B1* | 8/2016 | Kokenda | H01R 25/145 |
| 2010/0139945 A1* | 6/2010 | Dargatz | H01R 25/14 174/116 |
| 2012/0058675 A1* | 3/2012 | Hofer | H01R 43/26 439/620.21 |
| 2015/0371731 A1* | 12/2015 | Newman | H02G 5/06 174/110 R |
| 2017/0346245 A1* | 11/2017 | Zhu | H01R 4/42 |

* cited by examiner

*Primary Examiner* — Stanley Tso
(74) *Attorney, Agent, or Firm* — Osborne Law LLC

(57) ABSTRACT

An electrical distribution system for providing electric power to cranes, hoists, elevators and the like which move on a track, tower or support beam. In particular, a modular electrical system comprised of a modular buss bar system which provides electrical power for operation of construction cranes, hoists, elevators and the like on a construction or material transfer site or permanent building including a system and apparatus which is configurable to provide an easily movable and/or reconfigurable electrical power distribution system which is mounted to a construction mast, hoist, elevator or building under construction during the building construction process, a permanent building, or to a horizontal overhead crane support beam. In a further embodiment, a heating system for a modular buss bar system is provided which prevents the formation of ice and snow on the electrical contacts of a modular buss bar electrical system.

19 Claims, 4 Drawing Sheets

MODULAR BUSS BAR ELECTRICAL POWER DISTRIBUTION SYSTEM FOR CRANES, ELEVATORS AND HOISTS

BACKGROUND

Field of the Invention

The present invention relates to the field of structural, material handling and building systems and structural components used in such systems, and more particularly to strong, multi-purpose, light-weight and easily transportable structural, material handling and building systems and components for use with construction cranes or hoists or temporary or permanent elevators, and more particularly to a modular electrical system comprised of a modular buss bar system which provides electrical power for operation of construction cranes, hoists, elevators and the like on a construction or material transfer site or permanent building including a system and apparatus which is configurable to provide an easily movable and/or reconfigurable electrical power distribution system which is mounted to a construction mast, hoist, elevator or building under construction during the building construction process, or to a horizontal overhead crane or a permanent building structure. In a further embodiment, a heating system for a modular buss bar system is provided which prevents the formation of ice and snow on the electrical contacts of a modular buss bar electrical system.

Background and Description of Related Art

When engaged in dangerous construction situations and the like, including construction and maintenance of tall buildings or material handling operations in construction or other areas, it is imperative to insure the safety of those involved as well as pedestrians, bystanders or others in the vicinity of the construction area. To that end, it is critical to use systems for cranes, hoists and elevators which are structurally sound. For purposes of efficiency and utility, it is also important to use systems for cranes, hoists and elevators which are lightweight and reliable during use. It is further important to use systems which can be straightforwardly configured, disassembled and moved on the job site. Structural integrity of any crane, hoist or elevator system on a job site, material handling site or permanent building is paramount. In particular, natural forces such as bad weather, e.g., snow, ice, rain, wind, temperature, material conditions, material properties, worker competency, worker capability etc., have for many years caused accidents in the nature of falling debris, workpieces, construction material or components of systems put in place to facilitate construction of a building, e.g., a high rise building under construction or maintenance, as well as other material handling sites. A properly configured and structurally sound crane, elevator or hoist electrical supply system in such construction projects significantly reduces the risk of injury or damage to workers or pedestrians in the vicinity of the construction or material handling zone. Various electrical supply systems for cranes, elevators and hoists for high-rise construction projects, material handling sites, and the like, have been provided in the past, but their implementation requirements and constraints and lack of ease of assembly, use or reconfiguration have been severe limitations in the effectiveness and efficiency of such systems. Specifically, an electrical supply system incorporating a buss bar power distribution apparatus that is modular, easy to configure on the job site, easy to reconfigure on the job site, and which provides reliable and continuous electrical power to construction cranes and hoists as well as elevators (both temporary and permanent) is provided.

Various types of structural components and systems have been developed or used for supplying electrical power to construction cranes, hoists, elevators and the like. While functional, a common problem with systems and components for supplying electrical power to the moving components of construction cranes and hoists or elevators is that they are heavy, difficult to handle, move or reconfigure and have a relatively high cost. For example, cable systems for such applications typically involve a very heavy cable which is unwound as a lift car or crane moves up a tower (referred to as a "travel cable"). This type of system suffers from numerous infirmities, including that the entire weight of the power supply cable is borne by the hoist car or crane, which is clearly not an optimally stable solution due, inter alia, to the heavy load on the car due to the weight of the cable and the fact that swaying of the cable due to wind loading or the like could induce dynamic loading effects which could overstress the structure of a crane or lift hoist, or supporting tower for either. A better solution would be to integrate the power supply mechanism with the tower on which the hoist, crane or elevator is mounted such that the load is dispersed along the entire height of the tower and no "lump mass" exists which may cause unwanted oscillations or instabilities of the tower system overall. Also, breaks in the cable may be difficult to locate and their repair also difficult to achieve due to the need to splice or repair a continuous cable. Typically, repair of a continuous cable used to supply electrical power in a hoist, crane or elevator system is not even performed on the job site due to these issues. Rather, the entire cable is replaced. This is clearly a very costly solution to a broken power supply (travel) cable. It would therefore be desirable to replace a travel cable with a modular system which would be repairable by replacing only a section of the overall power distribution system when a failure occurs. The same advantages are obtained by using a modular buss bar system for distributing power as detailed in the presently described and claimed invention in the context of a horizontal overhead crane.

In contrast to use of a continuous wound cable to supply power to a construction hoist or crane or elevator, the system described and claimed herein operates by, inter alia, eliminating a wound cable supply system and instead operates via buss bar strips of specialized configuration which are installed on a support tower in discrete pieces, i.e., the entire power supply system is comprised of modular units which are manufactured off site and installed/configured on the job site. The system described and claimed herein is thus much easier to handle, install and reconfigure during the building construction process. The present system also provides a power supply mechanism which is much more structurally stable than a wound cable for the reasons previously explained. The presently disclosed and described system takes the travel cable weight entirely off of a vertically oriented hoist car or crane and instead distributes that weight evenly along the tower or mast on which the hoist, crane or elevator operates. The same is true for a horizontally oriented overhead crane. It can also be expected that the presently described system may reduce the total weight on a vertical mast by on the order of fifty percent due, e.g., to the fact that the modular buss bar system described and claimed herein has a much lower weight per unit length as compared to a power supply cable in a spooled cable power supply system. Moreover, as mentioned, the inventive system distributes the weight along a mast as opposed to concentrating the weight at the point where the hoist or elevator car contacts the mast. Similar advantages and efficiencies are obtained in the context of horizontally oriented overhead cranes.

Still further, prior electrical supply systems which utilized buss bar power distribution relied on systems comprised of multiple components including exposed conductive/electrified elements, e.g., Mayo U.S. Pat. No. 3,316,362, which disclosed such a system. See for example FIGS. 1 and 2 of Mayo '362, which discloses a power conductor portion 50 and a contact surface portion 25. The contact surface portion 25 is not shielded by insulating material or containment and is thus susceptible to electrical shorting if it comes in contact with a conductive element other than the shoe 26 it is designed to contact. This is a significant limitation of prior systems, i.e., the electrified elements of the power supply system are exposed to potential shorting from external sources. A preferable approach would be to encase or shield the electrified elements even if the mobile collector portions of the system are somewhat exposed so as to enable contact between the supply source and the collector portion. However, the prior approaches did not do so nor recognize the need for such an approach. In fact, prior approaches maximized the amount of exposed electrical contact area in order to facilitate electrical power transmission between the supply source and the collector.

While electrical power supply systems were previously known in the context of supplying power for mobile machinery, such systems have classically been cumbersome, inefficient or less than ideal for the reasons heretofore discussed. Similarly, while the provision of heating elements in the context of such power supply systems has been previously known for inhibiting the formation and/or retention of ice, snow or frozen moisture in such systems, no simple, modular, integrated, efficient heating apparatus for such applications has heretofore been produced. A particular problem manifested in electrical supply systems for hoists, cranes and elevators is that in colder climates ice, sleet, snow and frost are formed and retained on conductor bars of such systems. In such a situation, the frozen moisture provides a very high resistance path for transmission of electrical current between the stationary conductor bars and the mobile collector mechanisms on the mobile machinery or equipment. This may reduce, hinder or disrupt the power needed to operate the mobile machinery or equipment. See, e.g., U.S. Pat. No. 3,316,362 col. 1, lines 23-55.

SUMMARY

The buss bar electrical system described herein is formed by integration of modular components having particular geometric configuration which provides an improved buss bar electrification system for constructions hoists, cranes, elevators and the like.

An aspect of the disclosed invention is to address the above-described deficiencies of the related art by providing a structural member and accessory components to create versatile, lightweight, strong, relatively inexpensive, easily assembled, easily transportable, easily reconfigurable and easily adjustable structures for providing a buss bar system for construction hoists, cranes, elevators (including permanent building elevators both inside and outside the building peripheral walls) and the like.

An aspect of the invention involves provision of buss bar structural components which provide a partially shielded conductor contact portion in order to enhance safety and reduce the infiltration of foreign material into the electrical contact area portion of the system.

A further aspect of the present invention is that a housing comprised of a non-electrically conductive (or low conductive) material is attached to a rigid (for example aluminum or steel) base which base is attached to a hoist, elevator or crane tower or horizontal support structure or the like. The non-conductive housing includes within its interior buss bar elements of particular configuration such that the contact portion of the buss bar is at least partially enclosed and the interior of the housing is configured such that the buss bar elements are not in electrical contact with the base. The buss bar elements are thus electrically isolated from the hoist, elevator or crane tower or horizontal support structure and thus grounding and shorting are prevented.

A further aspect of the present invention is that a housing comprised of a non-electrically conductive (or low conductive) material is attached to a rigid non-electrically conducting base which base is attached to a hoist, elevator or crane tower or the like. The non-conductive housing includes within its interior buss bar elements of particular configuration such that the contact portion of the buss bar is at least partially enclosed and the interior of the housing is configured such that the buss bar elements are not in electrical contact with the hoist, elevator or crane tower or horizontal support structure. The buss bar elements are thus electrically isolated from the hoist, elevator or crane tower or horizontal support structure and thus grounding and shorting are prevented.

A further aspect of the present invention is that rigid electrically conductive pins are inserted into holes in the respective ends of buss bar elements so that a series of buss bar elements can be connected to each other in order to extend the full functional length of a crane, elevator or hoist tower by extending the length of the global buss bar power supply system the full extent of the hoist, elevator or crane travel length. Alternatively, the pin can form part of at least one buss bar member and fit into a hole in a longitudinally adjacent buss bar member. These rigid pins maintain structural rigidity of the overall buss bar system while maintaining electrical connectivity between individual modular sections of the buss bar system.

A further aspect of the present invention is that opposing ends of the buss bar elements are configured with male plugs or female receptacles, respectively so that a series of buss bar elements can be connected to each other in order to extend the full functional length of a crane, elevator or hoist tower by extending the length of the global buss bar power supply system the full extent of the hoist, elevator or crane travel length. These plugs and receptacles maintain structural rigidity of the overall buss bar system while maintaining electrical connectivity between individual modular sections of the buss bar system.

Alone, the described modular buss bar structural member embodiment of the invention benefits from a cross-section that provides resistance to applied loads in all dimensions under a variety of loading conditions (compression, tension, shear, torsion, combined loading, etc.). When used in combination with other components, such as a hoist, elevator or crane tower and similar structures, a variety of strong and versatile hoist, elevator or crane tower structures including a buss bar electrification system can be created quickly, efficiently and inexpensively.

Due primarily to the light weight and modular nature of the buss bar structural member described herein, the systems described herein may be implemented in locations where additional weight must be kept to a minimum. Hoist, elevator and tower crane masts are of course comprised of structurally substantial materials of significant weight. Adding a heavy buss bar system would be problematic from the perspective of static weight loading as well as creating the risk of problems via dynamic wind loading or other mechanical oscillation issues. The described buss bar structural members are also readily susceptible to installation, reconfiguration or tear down due to their low weight and modularity.

An aspect of the invention is to provide a buss bar electrification system for construction hoists, cranes, elevators and the like which provides a heat generating element adjacent the buss bar contact portion which is entirely encased in a non-conducting insulator material which, together with the buss bar elements, are situated inside the non-conductive housing and are thereby shielded from external elements including weather. Providing a heat generating element directly adjacent the buss bar contact portion ensures that maximum heat will be applied to the contact portion which needs to be kept free from frozen moisture accumulation.

In a further embodiment, the placement of a modular heating element, which may be comprised of a heat tape or cable, inside a cavity in a modular buss bar results in a system which is capable of preventing ice accumulation on the buss bar and thus prevents loss of electrical contact between the buss bar and collector during operation in freezing conditions. The placement of the heat element is directly adjacent the portion of the buss bar which provides the contact point for the collector mechanism. A system is therefore provided which provides heat in a direct manner to the contact portion, thus resulting in the enhanced likelihood that freezing of moisture on the contact portion is prevented.

The benefits to the aforementioned buss bar structural member and system should become apparent to those knowledgeable in the art, in light of the below detailed description, claims, and drawings. The foregoing summary includes example embodiments of the system, method and articles that are not intended to be limiting. The above embodiments are used merely to explain selected aspects or steps that may be utilized in implementations of the present disclosure. However, it is readily apparent that one or more aspects, or steps, pertaining to an example embodiment can be combined with one or more aspects, or steps, of other embodiments to create new embodiments still within the scope of the present disclosure. Therefore, persons of ordinary skill in the art would appreciate that various embodiments of the present disclosure may incorporate aspects from other embodiments, or may be implemented in combination with other embodiments.

DESCRIPTION OF DRAWINGS

The description of the various example embodiments is explained in conjunction with appended drawings, in which.

DETAILED DESCRIPTION OF EXEMPLARY EMBODIMENTS

Figure 1:
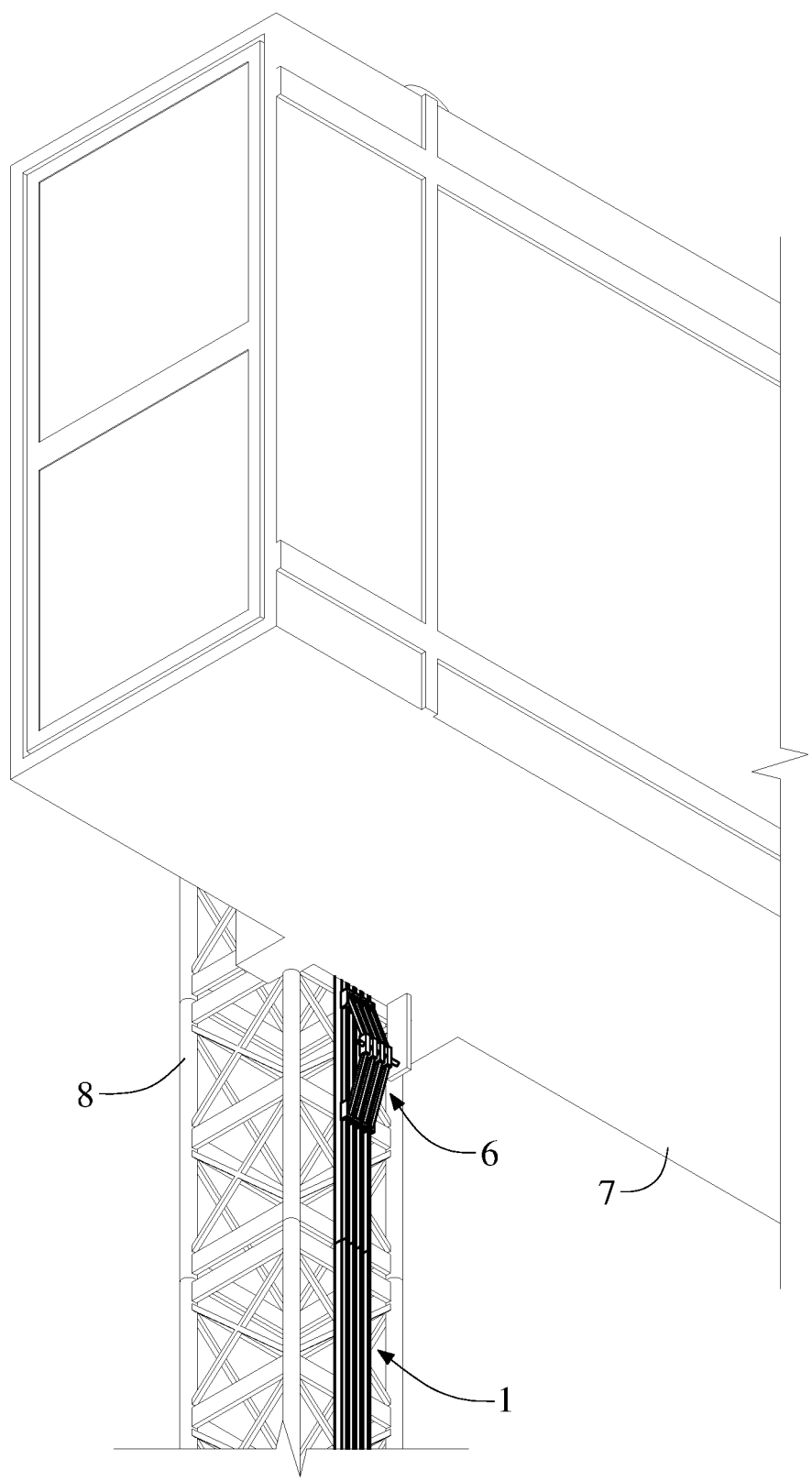
FIG. 1 shows an isometric view of a hoist tower system falling within the scope of the present disclosure.

As mentioned above, in contrast to use of a continuous wound cable to supply power to a construction hoist, elevator or crane, the system described and claimed herein operates by, inter alia, eliminating the need for a wound cable supply system and instead operates via buss bar strips of specialized configuration which are installed on a support tower or overhead crane support beam in discrete pieces, i.e., the entire power supply system is comprised of modular units which are manufactured off site and installed/configured on the job site. The described and claimed system is thus much easier to handle, install, reconfigure and tear down during a building construction process including during configuration or reconfiguration of a hoist or elevator tower or crane as the building progresses or under other circumstances necessitating reconfiguration of a hoist or crane support mechanism. As also mentioned previously, the present described and claimed system also provides a power supply mechanism which is much more structurally stable than a wound cable for the reasons previously explained. The presently disclosed and described system takes the travel cable weight entirely off a hoist or elevator car or crane and instead distributes that weight evenly along the tower or mast on which the hoist, elevator or crane operates. The presently described system may reduce the total weight on a tower or mast by as much as fifty percent due, e.g., to the fact that the modular buss bar system described and claimed herein has a much lower weight per unit length as compared to a power supply cable in a spooled cable system. Moreover, as mentioned, the inventive system distributes the weight along a mast as opposed to concentrating the weight at the point where the hoist or elevator car contacts the mast, thus eliminating concentration of weight and lessening the possibility of induced dynamic effects in wind storms or due to other dynamic inputs.

In vertical hoist, elevator or crane tower embodiments, the buss bar system as described herein is formed by integration of substantially vertical buss bar component members to form a power supply mechanism which extends the full length of, e.g., a hoist or elevator car tower, vertical crane tower or horizontal crane support structure (the buss bar component members extending horizontally in a horizontal crane embodiment). Each individual buss bar component is attached to the hoist, elevator or crane tower or support structure as part of a modular buss bar apparatus and is connected to adjacent buss bar components via conductive connector pins or the like which provide a structural and electrical connection. Such a buss bar system as implemented in a hoist tower embodiment falling within the scope of the present disclosure is shown in FIG. 1.

The modular buss bar system described herein is typically designed and engineered to be used to extend vertically on a construction hoist, elevator, vertical crane tower or horizontal crane support structure to provide electrical energy to the moving hoist car or crane. As noted, in addition to vertical tower embodiments as shown in FIG. 1, such modular buss bars may be used in horizontal overhead cranes used in material handling or other applications where the movement of the crane is horizontal rather than vertical. Typical lengths for the modular buss bar components may be of any practical dimension. However, it is believed that 8 to 16 foot lengths would be the most practicable. Likewise, modular heating element components used in the modular buss bar components could be of any practicable length. For example, they may be the same length as the buss bar components or they may be of a length equivalent to two or more buss bar components.

Figure 2:
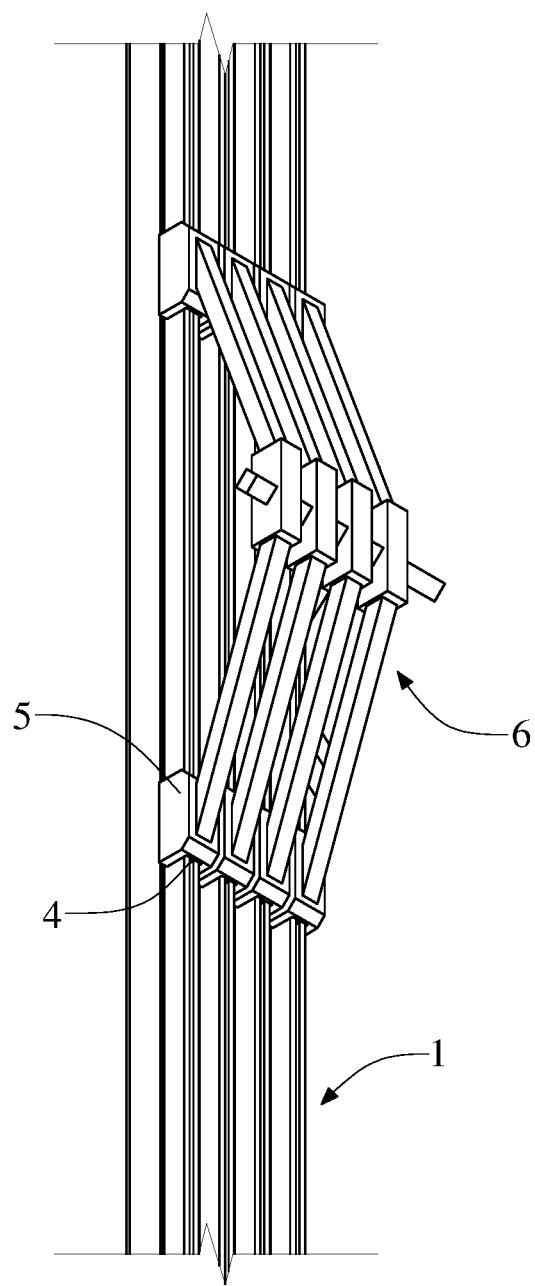
FIG. 2 shows an isometric view of a modular buss bar and collector system falling within the scope of the patent disclosure.
Figure 3:
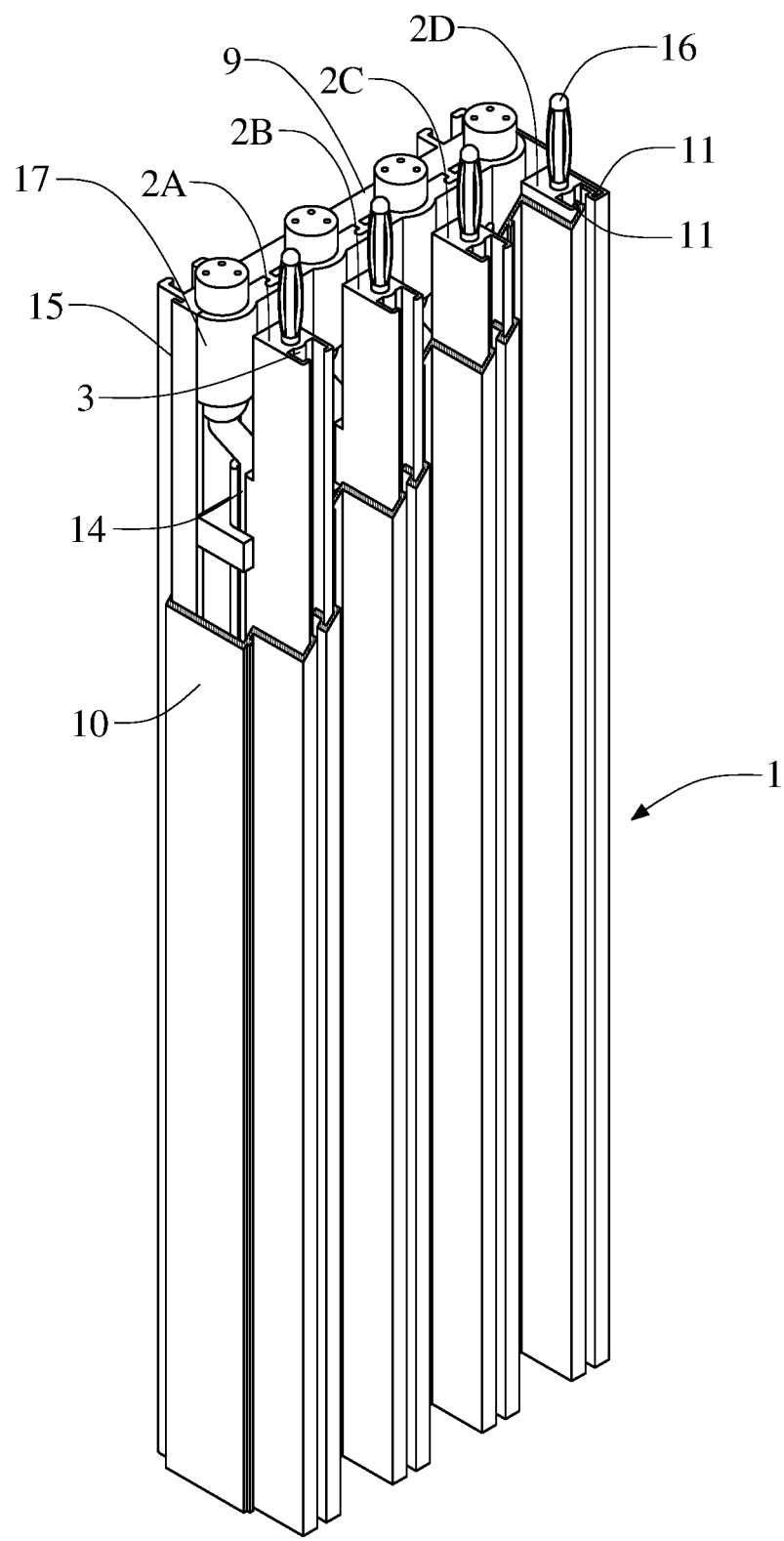
FIG. 3 shows an isometric view of a modular buss bar system used in a hoist tower system falling within the scope of a preferred embodiment of the invention described herein.

As shown in FIG. 3, each modular buss bar section 1 includes a plurality of vertically extending electrically conductive buss bar elements 2A-D, each bar element having an exposed surface 3 which is engaged by a conductive element 4 which comprises part of a collector component 5 included in a collector assembly 6. The collector assembly 6 is attached to a movable hoist or elevator car or crane 7 as shown in FIG. 1. Components 4, 5 and 6 are shown in FIG. 2. A typical collector assembly includes a collector contact portion which is attached to a portion of the collector assembly which is pivotally connected to components which are in turn rigidly attached to the moving portions of the crane or hoist. In this manner, the collector assembly includes a collector contact portion which is spring loaded or biased so as to continuously contact the electrically conductive exposed contact portion of the buss bar elements. The electrically conductive buss bar elements 2A-D are of course electrically isolated or insulated from each other.

In a particular vertically oriented embodiment, the buss bar sections are attached to a stationary hoist, elevator car or crane tower 8 via a base component 9 of the modular buss bar section, as shown in FIGS. 1 and 3. The base 9 may be attached to the tower via bolts, pins, brackets or other mechanisms in any conventional manner. The electrically conductive buss bar elements 2A-D as shown in FIG. 3 may be comprised of any suitably rigid electrically conductive material including aluminum, copper, steel or an electrically conductive alloy of different metals. Likewise, the connector pins 16 between longitudinally extending buss bar sections may be comprised of any suitably rigid electrically conductive material.

Each buss bar element is connected longitudinally to an adjacent buss bar element via connector pins 16. The connector pins join adjacent ends of adjacent buss bar sections to electrically and structurally join the respective sections in a particular hoist or crane power distribution system. The respective ends of adjacent buss bar sections are joined by frictionally fitting connector pins 16 into cavities formed in adjoining bus bar sections so as to connect the buss bar elements and orient the buss bar elements such that they abut each other and form a rigid connection, and also thereby provide a continuous pathway for the collector element to contact the buss bar contact portion. In one embodiment, the electrically conductive pins have a substantially circular cross section. In a further embodiment, the electrically conductive pins contain longitudinally oriented raised ridges to provide frictional contact points and thus increase the rigidity of the connection between adjacent buss bar elements. In a further embodiment, the raised ridges on the electrically conductive pins may be spring loaded or biased so as to provide a transverse force on the receiving portion or cavity in the buss bar into which the pins are inserted, thus providing an enhanced frictional fit and enhanced electrical contact. In a still further embodiment of the present invention, opposing ends of the buss bar elements are configured with integral male plugs or female receptacles, respectively, so that a series of buss bar elements can be connected to each other in order to extend the full functional length of a crane or hoist tower or elevator tower by extending the length of the global buss bar power supply system the full extent of the hoist, elevator or crane travel length. These plugs and receptacles maintain structural rigidity of the overall buss bar system while maintaining electrical connectivity between individual modular sections of the buss bar system.

The electrified elements of the power supply system are exposed to potential shorting from external sources. In a buss bar system, electrical contact portions of the system are at least somewhat exposed so as to enable contact between the supply source and the mobile collector portion of the electrical transmission system. In the described and claimed system herein, the modular buss bar sections 1 are configured such that the electrically conductive buss bar elements 2A-D are electrically isolated from the hoist, elevator or crane tower. This is achieved by anchoring the electrically conductive buss bar elements in a non-conductive encapsulating structure 10, thus isolating the buss bar elements from the modular buss bar section base 9 or the tower (in embodiments where the base may comprised of a non-electrically conducting material). The electrically conductive buss bar elements may be anchored in the non-conductive encapsulating structure via any suitable means, for example by mating frictional fit tabs or prongs 11 on the buss bar elements which slide into voids or recesses in the encapsulating structure 10. In one embodiment, portions of the buss bar member and portions of the non-electrically-conductive housing which are slidably engaged are formed by at least two projecting tabs or prongs formed on the buss bar member, wherein a cross section of each tab/prong contains two substantially 90 degree angles such that the tabs each have an "L" cross section as shown in FIG. 3, and wherein the housing contains recesses or voids which mirror the cross sections of the respective buss bar tabs/prongs such that a frictional fit is created when the tabs and voids are slidably engaged and wherein the distal ends of the tabs, i.e, the bottom or base portion of the "L" cross section, provide enhanced protection from rain, moisture or frozen precipitation and provides a partial encapsulating structure for the electrical collector which provides enhanced electrical contact between the buss bar element and the collector. The 90 degree angles serve to provide a tight fit of the prongs within their respective voids. Of course, frictionally fit components having other particular geometries would serve the mating function adequately, including different angular orientations or shapes which provide frictional or mechanical fits or retaining forces.

Likewise, the non-conductive encapsulating structure may be mated via frictional fit to the base 9 which includes tabs/prongs 15 as shown in FIG. 3. In one embodiment, the non-electrically conductive housing is integrally attached to the rigid base via sliding engagement formed by at least two projecting tabs/prongs formed on either side of the base over which a portion of the housing fits on either side of the base. The base tabs/prongs 15 may be formed of substantially 90 degree angles, or some other angle or curvature which retains the housing in place, wherein a cross section of the housing contains voids which mirror the cross sections of the respective base tabs such that a frictional fit is created when the tabs and voids are slidably engaged. Of course, frictionally fit components having other particular geometries would adequately serve the function of attaching the encapsulating structure to the base. The housing could also be attached by bolts or screws placed transversely on either side of the assembly which rigidly join the housing to the base.

The encapsulating structure 10 may be made of any substantially non-electrically-conductive material which is structurally adequate to withstand the mechanical loads presented by the weight of the modular buss bar elements and operation of the hoist, elevator or crane, as well as wind, ice or other external loads. Suitable extruded or molded plastics are envisioned for use as the encapsulating structure material. The electrified elements of the power supply system are thus substantially shielded from potential shorting from external sources via substantial encasement of the electrified elements of the modular buss bar electrical supply source and collector portions of the system.

Figure 4:
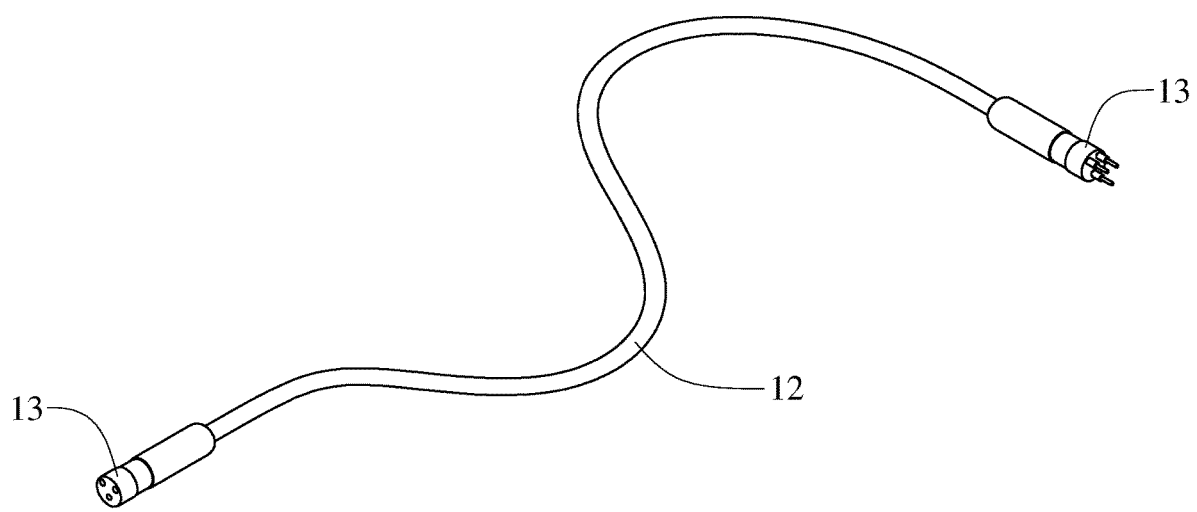
FIG. 4 shows a heating element cable used in an embodiment of the invention described herein.

Typically the heating element components 12 will be connected via plugs or sockets 13 at their ends via connections shown in an exemplary embodiment in FIG. 3 and FIG. 4. The heating element components are placed longitudinally into recessed areas 14 of the modular buss bar elements. Material may be removed from the ends of the buss bar elements to facilitate the plug or socket connectors at points where heating element sections are joined. Alternatively, the heating element connector components (sockets or plugs) can simply hang off the side of the heating element pathways (recessed areas 14) in the open areas of the modular buss bar assembly adjacent the buss bar conducting elements. In an alternative embodiment as shown in FIG. 3, the heating element plug portions are rigidly attached to the base element 9 via a clamping mechanism 17 which may be either bolted, screwed on or engaged via sliding frictional fit. Of course, the heat generating element could be rigidly attached to the buss bar element along its entire length as opposed to attachment of the end portions of the heat generating element to the base portion. The embodiment shown in FIG. 3 includes 4 distinct heat generating elements, one corresponding to each conductive buss bar element 2A-D. However, it should be appreciated that a person of skill in the art would understand that a unitary heat generating element could be used which provides direct heat to each conductive buss bar element but is electrified by the same electrical supply source. For example, there may be one connector plug at each end of a modular buss bar section which branches off to four different heat generating elements which contact the conductive buss bar elements.

In one embodiment, the heat generating element is capable of maintaining a buss bar contact portion temperature of at least 45 to 50 degrees Fahrenheit, thus assuring that frozen moisture will be continuously melted during operation of the crane, elevator or hoist and thus avoid interruption of the electrical power distribution system. In a further embodiment, the heat generating element is capable of dissipating heat at a rate of at least 1 watt per foot. Of course, any heat tape which will fit within the modular system and provide sufficient heat to prevent formation of ice on the buss bar contact portion or collector will fall within the scope and spirit of the present invention. The heat generating element embodiment of the present invention may not be applicable to permanent elevators inside of buildings. However, this embodiment may be used in permanent elevator situations where, for example, the elevator is placed outside the heated periphery of a building. This embodiment could likewise be used inside of a peripheral structure where frozen precipitation could be expected to accumulate for whatever reason might cause such a situation.

In a particular embodiment, the cross section dimensions of the assembled base plate, buss bar elements and encapsulating structure as illustrated in FIG. 3 are less than 4 inches deep by 10 inches wide and at least 8 feet in length.

It is to be understood that other applications for, and combinations of, the subject modular buss bar system are possible, and that though not specifically set forth in this document, that the spirit of the invention may be practiced in other ways, all of which are encompassed by the disclosure herein.

The invention claimed is:

1. A modular buss bar system for use in distributing electrical power to a vertically or horizontally movable crane, hoist or elevator comprising:
    a housing comprised of a substantially non-electrically conductive material which is integrally attached to a rigid base, wherein said rigid base is attached to a hoist, elevator or crane tower or support beam,
    at least one electrically conductive buss bar member rigidly mounted in said housing, wherein the buss bar member is retained in the housing via frictional retention forces between portions of the buss bar member and portions of the housing resulting from sliding engagement of said portions of the buss bar member and said portions of the housing,
    wherein a contact portion of the buss bar member is at least partially enclosed and the interior of the housing is configured such that the buss bar member is not in contact with the rigid base, thus electrically isolating the buss bar member from a hoist, elevator or crane tower or beam,
    wherein said at least one buss bar member is rigidly connected via an electrically conductive pin to another buss bar member so as to form a longitudinally extending electrical current transmission path involving at least two buss bar members, wherein said pin is either inserted into holes in the respective ends of each buss bar member and the buss bar members are pressed onto the pin so as to form a frictional retention connection or the pin forms part of at least one buss bar member and fits into a hole in a longitudinally adjacent buss bar member, wherein the electrically conductive pin maintains structural rigidity of the two connected buss bar members while maintaining electrical connectivity between individual modular sections of the buss bar system, and
    wherein each buss bar element has at least two tabs each having an "L" shaped cross section and wherein both of the tabs slidably engage the encapsulating structure in the vicinity of the buss bar electrical contact portion.

2. The modular buss bar system of claim 1, wherein the non-electrically conductive housing is integrally attached to the rigid base via sliding engagement formed by at least two transversely projecting tabs formed on the base, wherein a cross section of the housing contains connection portions which fit over the tabs to hold the housing in place such that a frictional fit is created when the tabs and connection portions are slidably engaged.

3. The modular buss bar system of claim 1, wherein said electrically conductive pin has a substantially circular cross section and contains longitudinally oriented raised ridges which are spring loaded or biased so as to provide a frictional retention fit between longitudinally adjacent buss bar elements.

4. The modular buss bar system of claim 1, wherein each buss bar element is oriented between projections extending from the rigid base perpendicular to the long dimension of the rigid base, buss bar elements and housing so as to retain the buss bar element in place in concert with the housing.

5. The modular buss bar system of claim 1, wherein the cross section dimensions of the assembled base plate and encapsulating structure are less than 4 inches deep by 10 inches wide.

6. The modular buss bar system of claim 1, wherein the length of an assembled encapsulating structure, base plate and buss bar contained therein is greater than 8 feet.

7. The modular buss bar system in accordance with claim 1, wherein the encapsulating structure and base plate assembly contains four separate buss bar elements which are electrically isolated from each other.

8. A modular buss bar system for use in distributing electrical power to a vertically or horizontally movable crane, elevator or hoist comprising:
 a housing comprised of a substantially non-electrically conductive material which is integrally attached to a rigid base, wherein said rigid base is attached to a hoist, elevator or crane tower or support beam,
 at least one electrically conductive buss bar member rigidly mounted in said housing, wherein the buss bar member is retained in the housing via frictional retention forces between portions of the buss bar member and portions of the housing resulting from sliding engagement of said portions of the buss bar member and said portions of the housing,
 wherein a contact portion of the buss bar member is at least partially enclosed and the interior of the housing is configured such that the buss bar member is not in contact with the rigid base, thus electrically isolating the buss bar member from a hoist or crane tower or beam,
 wherein said at least one buss bar member is rigidly connected via an electrically conductive pin to another buss bar member so as to form a longitudinally extending electrical current transmission path involving at least two buss bar members, wherein said pin is inserted into holes in the respective ends of each buss bar member and the buss bar members are pressed onto the pin so as to form a frictional retention connection or the pin forms part of at least one buss bar member and fits into a hole in a longitudinally adjacent buss bar member, wherein the electrically conductive pin maintains structural rigidity of the two connected buss bar members while maintaining electrical connectivity between individual modular sections of the buss bar system, and
 a heat generating element adjacent the buss bar member contact portion which is substantially entirely encased in a non-conducting insulator material and is thereby electrically isolated from the buss bar member and is shielded from external elements including weather via the non-electrically conducting housing, wherein said heat generating element generates heat to melt any frozen moisture which may accumulate or form in the area surrounding and adjacent to the buss bar member contact portion.

9. The modular buss bar system of claim 8, wherein each buss bar element has at least two opposing tabs each having an "L" shaped cross section and wherein both of the tabs slidably engage the encapsulating structure in the vicinity of the buss bar electrical contact portion.

10. The modular buss bar system of claim 8, wherein the non-electrically conductive housing is integrally attached to the rigid base via sliding engagement formed by at least two transversely projecting tabs formed on the base, wherein a cross section of the housing contains connection portions which fit over the tabs to hold the housing in place such that a frictional fit is created when the tabs and connection portions are slidably engaged.

11. The modular buss bar system of claim 8, wherein said electrically conductive pin has a substantially circular cross section.

12. The modular buss bar system of claim 8, wherein said electrically conductive pin contains longitudinally oriented raised ridges.

13. The modular buss bar system in accordance with claim 8 wherein the heat generating element is comprised of an electric heat tape or electric heat generating cable.

14. The modular buss bar system in accordance with claim 8 wherein the heating element is mounted inside a longitudinal cavity in the buss bar member immediately adjacent the buss bar member contact portion.

15. The modular buss bar system in accordance with claim 8 wherein the heat generating element is comprised of at least two sections which are joined end to end by terminal plug portions having projecting prongs and recesses on respective adjacent ends of said two sections, said recesses being configured for receiving said prongs so as to form an electrical connection to supply energy for generating heat.

16. The modular buss bar system of claim 8, wherein the heat generating element is capable of maintaining a buss bar contact portion temperature of at least 45 to 50 degrees Fahrenheit.

17. The modular buss bar system of claim 8, wherein the heat generating element is capable of dissipating heat at a rate of at least 1 watt per foot.

18. The modular buss bar system of claim 15, wherein the heat generating element terminal plug portions are clamped, bolted or slidably attached to the base.

19. The modular buss bar system of claim 18, wherein the terminal plug portions are slidably attached to the base via at least two tabs projecting from the base which are slidably engaged with recesses in a retention cap which retains the terminal plug portions at each end of the modular buss bar section.

* * * * *